United States Patent
Suzuki et al.

(10) Patent No.: US 7,449,720 B2
(45) Date of Patent: Nov. 11, 2008

(54) EPITAXIAL WAFER FOR SEMICONDUCTOR LIGHT-EMITTING DEVICES, AND SEMICONDUCTOR LIGHT-EMITTING DEVICE

(75) Inventors: Ryoji Suzuki, Mito (JP); Akio Ohishi, Suginami (JP)

(73) Assignee: Hitachi Cable, Ltd., Tokyo (JP)

( * ) Notice: Subject to any disclaimer, the term of this patent is extended or adjusted under 35 U.S.C. 154(b) by 383 days.

(21) Appl. No.: 11/105,589

(22) Filed: Apr. 14, 2005

(65) Prior Publication Data

US 2006/0001042 A1 Jan. 5, 2006

(30) Foreign Application Priority Data

Jun. 3, 2004 (JP) .................. 2004-165187
Feb. 15, 2005 (JP) .................. 2005-037363

(51) Int. Cl.
*H01L 33/00* (2006.01)

(52) U.S. Cl. .................. 257/80; 257/99; 257/E33.001

(58) Field of Classification Search .................. 257/80, 257/82, 83, 79, 99, 96, 94, 103, E33.001, 257/E33.054, E33.077, E51.018; 372/50.1, 372/43.1
See application file for complete search history.

(56) References Cited

U.S. PATENT DOCUMENTS 6,487,226 B1 * 11/2002 Iwamoto et al. .......... 372/46.01
6,834,068 B2 * 12/2004 Onishi .................. 372/50.1

FOREIGN PATENT DOCUMENTS

| JP | 9-69667 | 3/1997 |
| JP | 9-298343 | * 11/1997 |
| JP | 2002-111052 | 4/2002 |

* cited by examiner

*Primary Examiner*—Howard Weiss
*Assistant Examiner*—Hoa B Trinh
(74) *Attorney, Agent, or Firm*—McGinn IP Law Group, PLLC

(57) ABSTRACT

An epitaxial wafer for semiconductor light-emitting devices has an n-type substrate, on which are sequentially formed an n-type cladding layer, an active layer, a p-type cladding layer having Mg as a p-type dopant, and a p-type cap layer. The p-type cap layer has at least two Mg-doped and Zn-doped layers that are formed sequentially from the substrate side.

10 Claims, 4 Drawing Sheets

US 7,449,720 B2

EPITAXIAL WAFER FOR SEMICONDUCTOR LIGHT-EMITTING DEVICES, AND SEMICONDUCTOR LIGHT-EMITTING DEVICE

The present application is based on Japanese patent application Nos. 2004-165187 and 2005-037363, the entire contents of which are incorporated herein by reference.

BACKGROUND OF THE INVENTION

1. Field of the Invention

The present invention relates to an epitaxial wafer for semiconductor light-emitting devices (light-emitting diodes, semiconductor lasers), and particularly, to an epitaxial wafer for semiconductor light-emitting devices suitable for aluminum gallium indium phosphorus (AlGaInP) series light-emitting devices using magnesium (Mg) as a p-type dopant, and a semiconductor light-emitting device fabricated using the same.

2. Description of the Related Art

Generally, conventional AlGaInP series crystal growth for semiconductor light-emitting devices using metal organic vapor phase epitaxy (MOVPE) uses silicon (Si) and selenium (Se) as n-type dopants, and zinc (Zn) and Mg as p-type dopants. In epitaxial wafers for semiconductor laser (LD) applications, when Zn is used as the p-type dopant, the carrier concentration of a p-type cladding layer is typically set to a relatively low concentration of the order of $4\times10^{17}$ $cm^{-3}$.

In recent years, in semiconductor lasers, high-density optical disk devices which use an AlGaInP series visible-ray semiconductor laser as a light source have been actively developed. A light source for read/write in this high-density optical disk device requires stable high-power and high-temperature operation. To this end, the carrier concentration of the p-type cladding layer has to be made still higher.

However, doping Zn to a high concentration would cause Zn to diffuse into an active layer during epitaxial growth, which would result in the problem of deterioration of device characteristics and reliability. For this reason, the doping concentration of Zn has to be low. More recently, as the p-type dopant, Mg with a small diffusion coefficient compared to that of Zn has been used for making the carrier concentration of the p-type cladding layer high.

Also, it is known that, in an n-type-upper-layer light-emitting diode (LED) in which on a p-type substrate are sequentially stacked a p-type cladding layer, an active layer, an n-type cladding layer and an n-type current diffusion layer, in order to solve the problem of deterioration of brightness caused by formation of a non-luminescent center resulting from Zn diffusion into the active layer where Zn is the p-type dopant of the gallium phosphorus (GaP) substrate, a zinc diffusion prevention layer is formed between the p-type cladding layer and the substrate, or in a portion of the p-type cladding layer (see, e.g., Japanese patent application laid-open No. 2002-111052).

Also, in a conventional epitaxial wafer for semiconductor light-emitting devices, for the purpose of forming a low-resistance electrode, in a top layer is formed a low-resistance cap layer (contact layer) doped to a high concentration. This cap layer is typically formed of gallium arsenic (GaAs), where Zn is used as a dopant so that it can be doped to a high concentration (see, e.g., Japanese patent application laid-open No. 9-69667).

It is known that, during high-power and high-temperature operation of the LED and LD, leak current due to electron overflow from the active layer to the p-type cladding layer becomes large, so that threshold current and operating current thereby increase. To achieve stable high-power and high-temperature operation, it is desirable that the carrier concentration of the p-type cladding layer is made as high as possible, but when Zn is used as the p-type dopant as in the conventional art, as the carrier concentration of the p-type cladding layer is made higher, Zn is caused to diffuse into the active layer, which results in a larger photoluminescence spectrum full width at half maximum (hereinafter, PL FWHM) of the active layer, and impaired crystal quality of the active layer, which becomes the cause of an increase in threshold current and operating current, and a reduction in reliability. As a solution thereto, the present applicant has suggested as a prior application that, using MOVPE as the crystal growing means, in an epitaxial wafer for LDs in which on an n-type GaAs substrate are sequentially stacked at least an n-type AlGaInP cladding layer, a multi-quantum well (MQW) active layer, a p-type AlGaInP first cladding layer, a p-type gallium indium phosphorus (GaInP) etch stop layer, a p-type AlGaInP second cladding layer, and a p-type gallium arsenic (GaAs) contact layer, the p-type dopant of the p-type AlGaInP first cladding layer, p-type GaInP etch stop layer and p-type AlGaInP second cladding layer is Mg; the p-type dopant of the p-type GaAs contact layer is Zn; and the carrier concentration of at least the p-type AlGaInP first cladding layer of the p-type AlGaInP first and second cladding layers is in a range of $8\times10^{17}$ $cm^{-3}$ to $0.3\times10^{18}$ $cm^{-3}$.

In this manner, it is effective to use Mg as the p-type dopant of the p-type AlGaInP cladding layer and Zn as the p-type dopant of the p-type GaAs contact layer which allows a carrier concentration of more than $1\times10^{19}$ $cm^{-3}$ to be relatively easily obtained so that sufficiently small contact resistance can be obtained. This allows the carrier concentration of the p-type cladding layer to be made higher to the order of $1\times10^{18}$ $cm^{-3}$.

As a problem, however, it has been found out that doping the carrier concentration of the p-type cladding layer to a higher concentration than $1\times10^{18}$ $cm^{-3}$ makes mutual diffusion of Zn and Mg remarkable, which results in the phenomenon of Zn of the p-type contact layer diffusing into the p-type cladding layer and active layer which are not at all doped with Zn. Therefore, there is the problem that further doping to a higher concentration than $1\times10^{18}$ $cm^{-3}$ results in a larger PL FWHM of the active layer, as in the case of use of Zn only as the p-type dopant.

In other words, in the prior art, when Zn which tends to diffuse is used as the p-type dopant of the p-type GaAs cap layer formed in the top layer, there is the problem that Zn doped into this p-type GaAs cap layer is caused to diffuse through the underlying p-type cladding layer into the active layer during its growth, which results in a deterioration in luminescent characteristics of the active layer.

As explained as the above prior application, in the case of use of Mg as the p-type dopant of the p-type cladding layer, particularly this Zn diffusion is remarkable, and in addition, diffusion of Mg which should originally be relatively difficult to diffuse is facilitated, which results in the significant problem of deterioration in luminescent characteristics of the active layer and the life of the device.

SUMMARY OF THE INVENTION

It is an object of the present invention to provide an epitaxial wafer for semiconductor light-emitting devices, which obviates this problem so as not to cause Zn diffusion of a GaAs cap layer into a p-type cladding layer and an active layer, and semiconductor light-emitting devices (LED, LD) which are therefore capable of stable high-power and high-temperature operation, and are of high reliability.

(1) According to one aspect of the invention, an epitaxial wafer for semiconductor light-emitting devices comprises:
an n-type substrate;
an n-type cladding layer;
an active layer;
a p-type cladding layer comprising Mg as a p-type dopant; and
a p-type cap layer,
wherein the n-type cladding layer, the active layer, the p-type cladding layer and the p-type cap layer are sequentially formed on the n-type substrate, and
wherein the p-type cap layer comprises at least two Mg-doped and Zn-doped layers that are formed sequentially from the substrate side.

It is preferred that the n-type substrate comprises GaAs, the n-type cladding layer comprises AlGaInP, the p-type cladding layer comprises AlGaInP, and the p-type cap layer comprises GaAs.

(2) According to another aspect of the invention, an epitaxial wafer for semiconductor light-emitting devices comprises:
an n-type substrate;
an n-type cladding layer;
an active layer;
a first p-type cladding layer;
a p-type etch stop layer;
a second p-type cladding layer; and
a p-type cap layer,
wherein the n-type cladding layer, the active layer, the first p-type cladding layer, the p-type etch stop layer, the second p-type cladding layer and the p-type cap layer are sequentially formed on the n-type substrate,
wherein the first p-type cladding layer, the p-type etch stop layer, and the second p-type cladding layer comprise Mg as a p-type dopant, and
wherein the p-type cap layer comprises at least two Mg-doped and Zn-doped layers which are formed sequentially from the second p-type cladding layer side.

It is preferred that the n-type substrate comprises GaAs, the n-type cladding layer comprises AlGaInP, the first p-type cladding layer comprises AlGaInP, the second p-type cladding layer comprises AlGaInP, and the p-type cap layer comprises GaAs.

It is preferred that the p-type etch stop layer comprises GaInP.

It is preferred that the epitaxial wafer in (1) or (2) further comprises:
a p-type intermediate layer formed between the p-type cladding layer and the p-type cap layer,
wherein the p-type intermediate layer is doped with Mg that reduces an interface resistance due to a bandgap discontinuity between the p-type cladding layer and the p-type cap layer.

It is preferred that the p-type intermediate layer comprises GaInP.

(3) According to another aspect of the invention, an epitaxial wafer for semiconductor light-emitting devices comprises:
a substrate comprising GaAs;
compound semiconductor layers epitaxially grown on the substrate; and
a cap layer formed as a top layer on the compound semiconductor layers,
wherein the compound semiconductor layers comprises a p-type layer comprising Mg as a p-type dopant,
wherein the cap layer comprises a GaAs series material, and
wherein the cap layer comprises at least two Mg-doped and Zn-doped layers that are formed sequentially from the substrate side.

(4) According to another aspect of the invention, a semiconductor light-emitting device, comprising:
an epitaxial wafer,
wherein the epitaxial wafer comprises:
an n-type substrate;
an n-type cladding layer;
an active layer;
a p-type cladding layer comprising Mg as a p-type dopant; and
a p-type cap layer,
wherein the n-type cladding layer, the active layer, the p-type cladding layer and the p-type cap layer are sequentially formed on the n-type substrate, and
wherein the p-type cap layer comprises at least two Mg-doped and Zn-doped layers that are formed sequentially from the substrate side.

It is preferred that the epitaxial wafer further comprises:
a p-type intermediate layer formed between the p-type cladding layer and the p-type cap layer,
wherein the p-type intermediate layer is doped with Mg that reduces an interface resistance due to a bandgap discontinuity between the p-type cladding layer and the p-type cap layer.

(5) According to another aspect of the invention, a semiconductor light-emitting device, comprising:
an epitaxial wafer,
wherein the epitaxial wafer comprises:
an n-type substrate;
an n-type cladding layer;
an active layer;
a first p-type cladding layer;
a p-type etch stop layer;
a second p-type cladding layer; and
a p-type cap layer,
wherein the n-type cladding layer, the active layer, the first p-type cladding layer, the p-type etch stop layer, the second p-type cladding layer and the p-type cap layer are sequentially formed on the n-type substrate,
wherein the first p-type cladding layer, the p-type etch stop layer, and the second p-type cladding layer comprise Mg as a p-type dopant, and
wherein the p-type cap layer comprises at least two Mg-doped and Zn-doped layers which are formed sequentially from the second p-type cladding layer side.

(6) According to another aspect of the invention, a semiconductor light-emitting device, comprising:
an epitaxial wafer,
wherein the epitaxial wafer comprises:
a substrate comprising GaAs;
compound semiconductor layers epitaxially grown on the substrate; and
a cap layer formed as a top layer on the compound semiconductor layers,
wherein the compound semiconductor layers comprises a p-type layer comprising Mg as a p-type dopant,
wherein the cap layer comprises a GaAs series material, and
wherein the cap layer comprises at least two Mg-doped and Zn-doped layers that are formed sequentially from the substrate side.

<Main Points of the Invention>

To achieve the above object, the present invention uses MOVPE as the crystal growth means, and in addition, as the p-type dopant of the first p-type cladding layer adjacent to the active layer, p-type etch stop layer and second p-type cladding layer, it uses Mg with a small diffusion coefficient instead of conventional Zn. Also, while in the same manner as the prior application, as the p-type dopant of the p-type cap layer the present invention uses Zn which is relatively easy to be doped to more than $1 \times 10^{19}$ cm$^{-3}$, in order to control Zn diffusion into the p-type cladding layer and active layer, the p-type cap layer comprises at least two Mg-doped and Zn-doped layers which are formed sequentially from the p-type cladding layer side. This enables the fabrication of an epitaxial wafer which allows obtaining an LD capable of high-power and high-temperature operation almost without increasing the PL FWHM of the active layer even when the carrier concentration of the p-type cladding layer is made higher than $1 \times 10^{18}$ cm$^{-3}$ which was hitherto difficult to be done without impairing the active layer quality.

In other words, the present invention comprises the at-least-two-layered p-type cap layer where the layer close to the substrate and active layer is the Mg-doped p-type layer and the other layer is the Zn-doped p-type layer. For such structure, the Mg-doped layer serves as a zinc diffusion suppression layer for suppressing diffusion of Zn in the other Zn-doped layer to cause almost no Zn diffusion to the active layer side relative to the Mg-doped layer. As a result, the prior-art problem of deterioration in luminescent characteristics of the active layer and the life of the device can be overcome.

Neither of above-mentioned Japanese patent application laid-open No. 2002-111052 and No. 9-69667 discloses such an idea that the p-type cap layer for suppressing Zn diffusion into the p-type cladding layer and active layer has an at-least-two-layered structure where the layer close to the substrate and active layer is the Mg-doped p-type layer and the other layer is the Zn-doped p-type layer.

<Advantages of the Invention>

According to the present invention, since the p-type cap layer comprising GaAs has an at-least-two-layered structure where the layer close to the n-type substrate and active layer is the Mg-doped p-type layer comprising GaAs and the other layer is the Zn-doped p-type layer comprising GaAs, and the Mg-doped p-type cap layer serves as a zinc diffusion suppression layer for suppressing diffusion of Zn in the other Zn-doped p-type cap layer, almost no diffusion of Zn in the p-type cap layer to the active layer side relative to the Mg-doped p-type cap layer is caused. In other words, since diffusion of Zn in the p-type cap layer into the cladding layer and especially into the active layer can very effectively be suppressed, no deterioration is caused in luminescent characteristics of the active layer and the life of the device. This results in less diffusion which therefore allows sufficiently taking advantage of use of Mg which can be doped to a high concentration in the p-type cladding layer, etc., and can provide an epitaxial wafer for semiconductor light-emitting devices suitable for the fabrication of light-emitting devices such as red semiconductor lasers, etc. which are excellent in high-power and high-temperature characteristics.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 1:
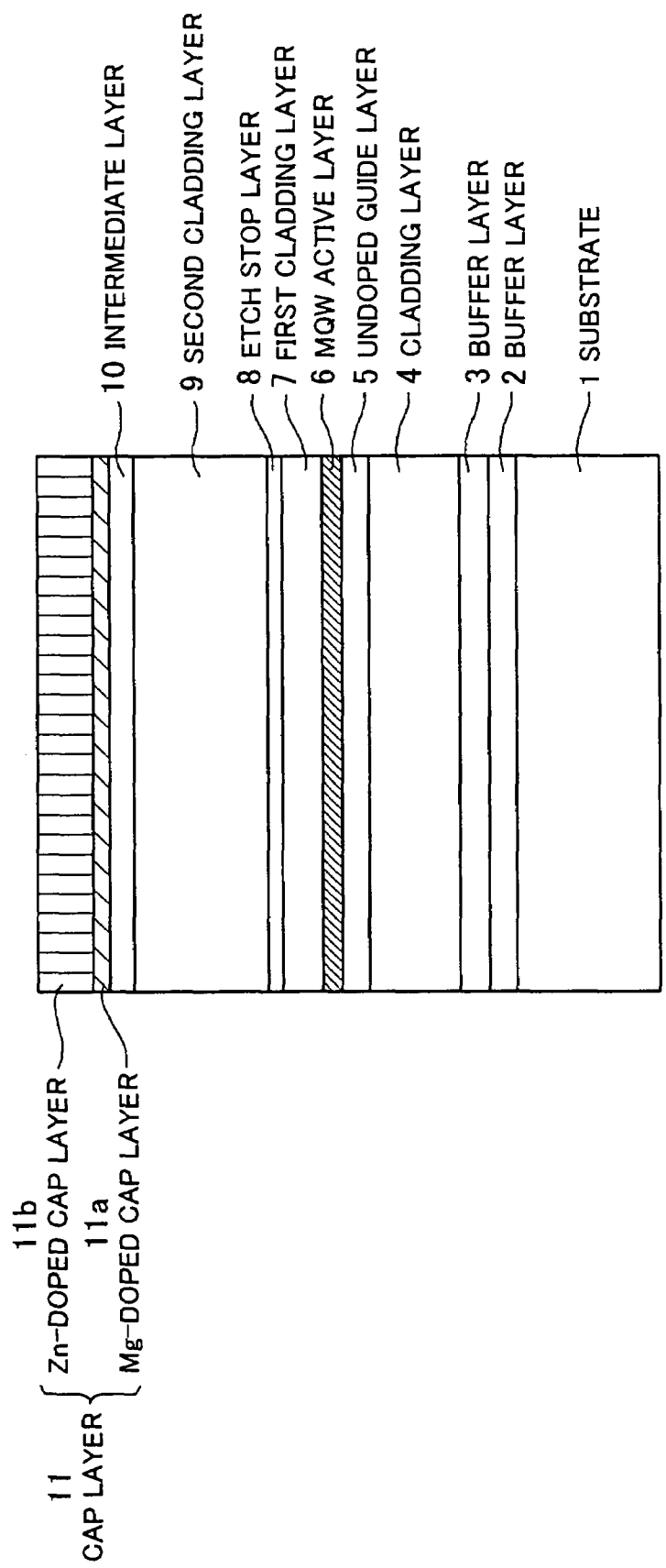
FIG. 1 is a cross-sectional schematic view illustrating an embodiment of an epitaxial wafer for semiconductor light-emitting devices (LDs) according to the invention.

FIG. 1 illustrates an epitaxial wafer for semiconductor light-emitting devices (LDs) comprising an n-type substrate 1 made of GaAs, on which are sequentially stacked an n-type buffer layer 2 made of GaAs, an n-type buffer layer 3 made of GaInP, an n-type cladding layer 4 made of AlGaInP, an undoped guide layer 5 made of AlGaInP, a multi-quantum well (MQW) active layer 6, a p-type first cladding layer 7 made of AlGaInP, a p-type etch stop layer 8 made of GaInP, a p-type second cladding layer 9 made of AlGaInP, a p-type intermediate layer 10 made of GaInP, and a p-type cap layer 11 made of GaAs.

The top-layer p-type cap layer 11 consists of at least two layers: a Mg-doped p-type cap layer 11a formed on the p-type second cladding layer 9 side, and a Zn-doped p-type cap layer 11b formed on the surface side. The p-type dopant doped into the p-type first cladding layer 7, p-type etch stop layer 8 and p-type second cladding layer 9 is Mg.

For such structure, the Mg-doped p-type cap layer 11a serves as a zinc diffusion suppression layer for suppressing diffusion of Zn in the other Zn-doped p-type cap layer 11b to cause almost no Zn diffusion to the active layer 6 side relative to the Mg-doped p-type cap layer 11a.

Figure 3:
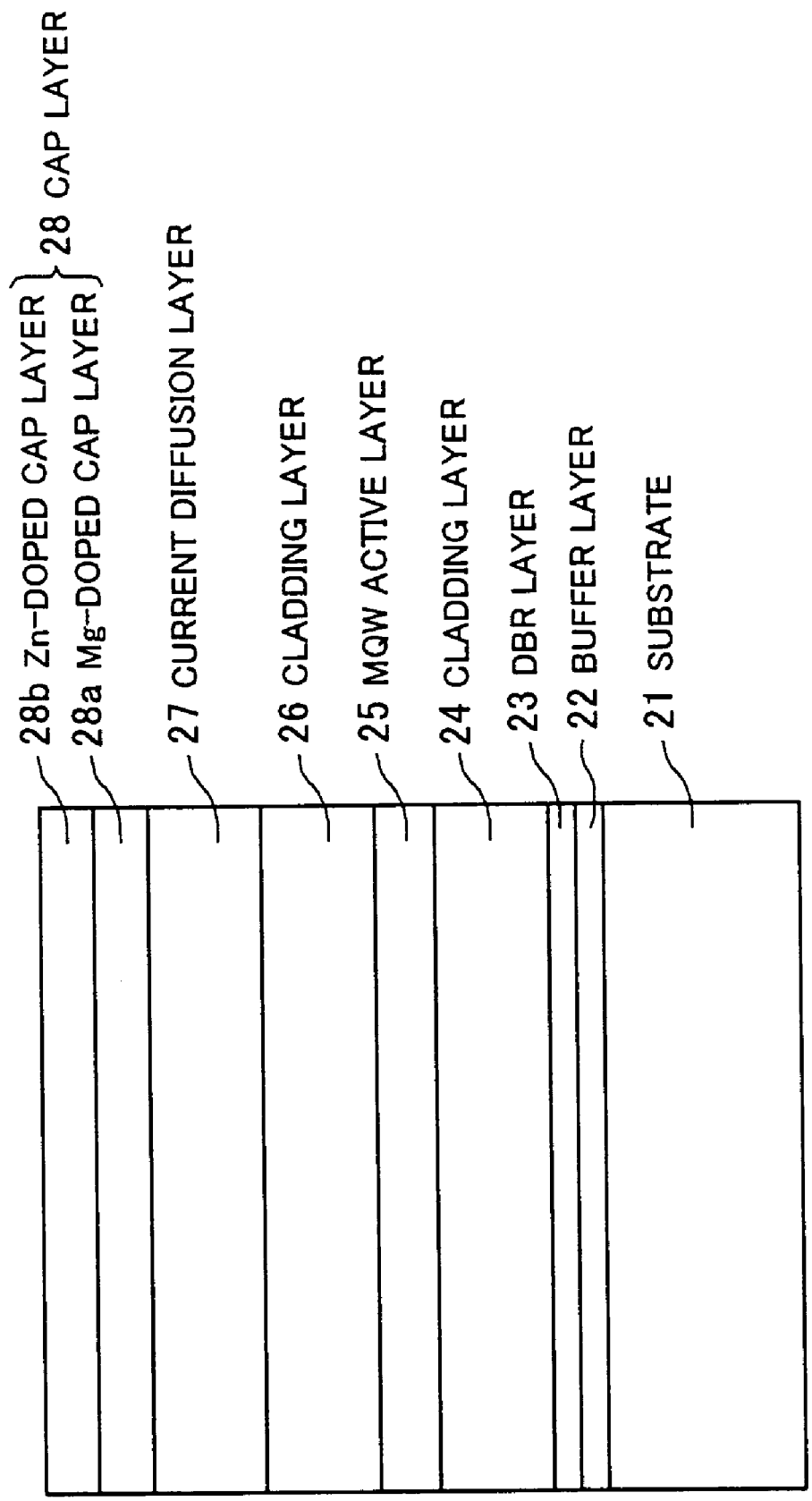
FIG. 3 is a cross-sectional schematic view illustrating an embodiment of an epitaxial wafer for semiconductor light-emitting devices (LEDs) according to the invention.

FIG. 3 illustrates an epitaxial wafer for semiconductor light-emitting devices (LEDs) as an alternative structure. This comprises an n-type substrate 21 made of GaAs, on which are sequentially stacked an n-type buffer layer 22 made of GaAs, an n-type DBR (distributed Bragg reflector) layer 23 made of a thin-film multi-layer structure of $Al_{0.5}Ga_{0.5}As$ and AlAs, an n-type cladding layer 24 made of AlGaInP, a multi-quantum well (MQW) active layer 25, a p-type cladding layer 26 made of AlGaInP, a p-type current diffusion layer 27 made of GaP, and a p-type cap layer 28 made of GaAs.

The top-layer p-type cap layer 28 consists of at least two layers: a Mg-doped p-type cap layer 28a formed on the p-type cladding layer 26 side, and a Zn-doped p-type cap layer 28b formed on the surface side. The p-type dopant doped into the p-type cladding layer 26 and p-type current diffusion layer 27 is Mg.

For such structure, in the same manner as the epitaxial wafer for semiconductor light-emitting devices (LDs) of FIG. 1, the Mg-doped p-type cap layer 28a serves as a zinc diffusion suppression layer for suppressing diffusion of Zn in the other Zn-doped p-type cap layer 28b to cause almost no Zn diffusion to the active layer 25 side relative to the Mg-doped p-type cap layer 28a.

Embodiment 1

As shown in FIG. 1, on an n-type substrate 1 made of GaAs are sequentially epitaxially grown an n-type buffer layer 2 made of GaAs, a lattice-matched n-type buffer layer 3 made of GaInP, and a lattice-matched n-type cladding layer 4 made of $(Al_{0.7}Ga_{0.3})_{0.5}In_{0.5}P$, on which are sequentially grown an undoped guide layer 5 made of $(Al_{0.5}Ga_{0.5})_{0.5}In_{0.5}P$, a multi-quantum well (MQW) active layer 6 constituted by a barrier layer and a strained GaInP well layer, a Mg-doped p-type first cladding layer 7 made of $(Al_{0.7}Ga_{0.3})_{0.5}In_{0.5}P$, a p-type etch stop layer 8 made of GaInP, a Mg-doped p-type second cladding layer 9 made of $(Al_{0.7}Ga_{0.3})_{0.5}In_{0.5}P$, and a Mg-doped p-type intermediate layer 10 made of GaInP.

And on the top portion are sequentially grown a Mg-doped p-type cap layer 11a made of GaAs serving as the zinc diffusion suppression layer of the invention, and a Zn-doped p-type cap layer 11b made of GaAs. Here, the Mg-doped p-type cap layer 11a on the Mg-doped p-type second cladding layer 9 side is 50 nm in thickness and $1 \times 10^{18}$ cm$^{-3}$ in carrier concentration, and the Zn-doped p-type cap layer 11b on the upper side is 450 nm in thickness and $5 \times 10^{18}$ cm$^{-3}$ in carrier concentration.

Figure 2:
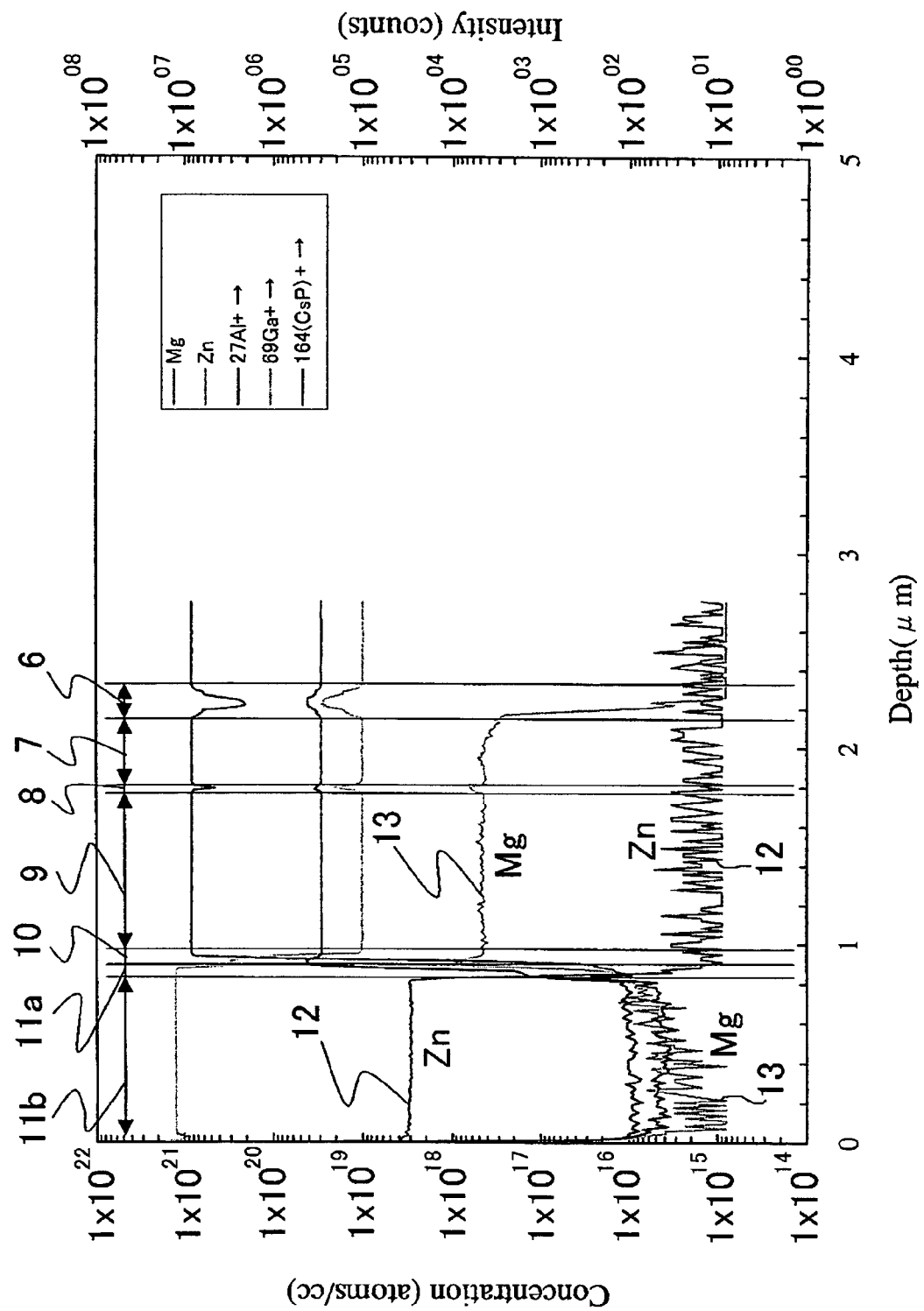
FIG. 2 is a diagram showing the SIMS analysis results of an epitaxial wafer for semiconductor light-emitting devices (LDs) including a zinc diffusion suppression layer according to the invention.

For the epitaxial wafer for semiconductor light-emitting devices (LDs) having the layer structure of the EMBODIMENT of the invention, Zn- and Mg-distribution status is examined by SIMS analysis. Its results are shown in FIG. 2. In the figure, curve 12 is a Zn-distribution profile, and curve 13 is a Mg-distribution profile. The zinc concentration shown by curve 12 of FIG. 2 is very small on the order of $1 \times 10^{15}$ cm$^{-3}$ in the Mg-doped p-type first cladding layer 7 and the Mg-doped p-type second cladding layer 9. In other words, in the case of this EMBODIMENT, it is seen that almost no diffusion of Zn in the top-layer Zn-doped p-type cap layer 11b into the Mg-doped p-type first cladding layer 7 and the Mg-doped p-type second cladding layer 9 is caused.

Figure 4:
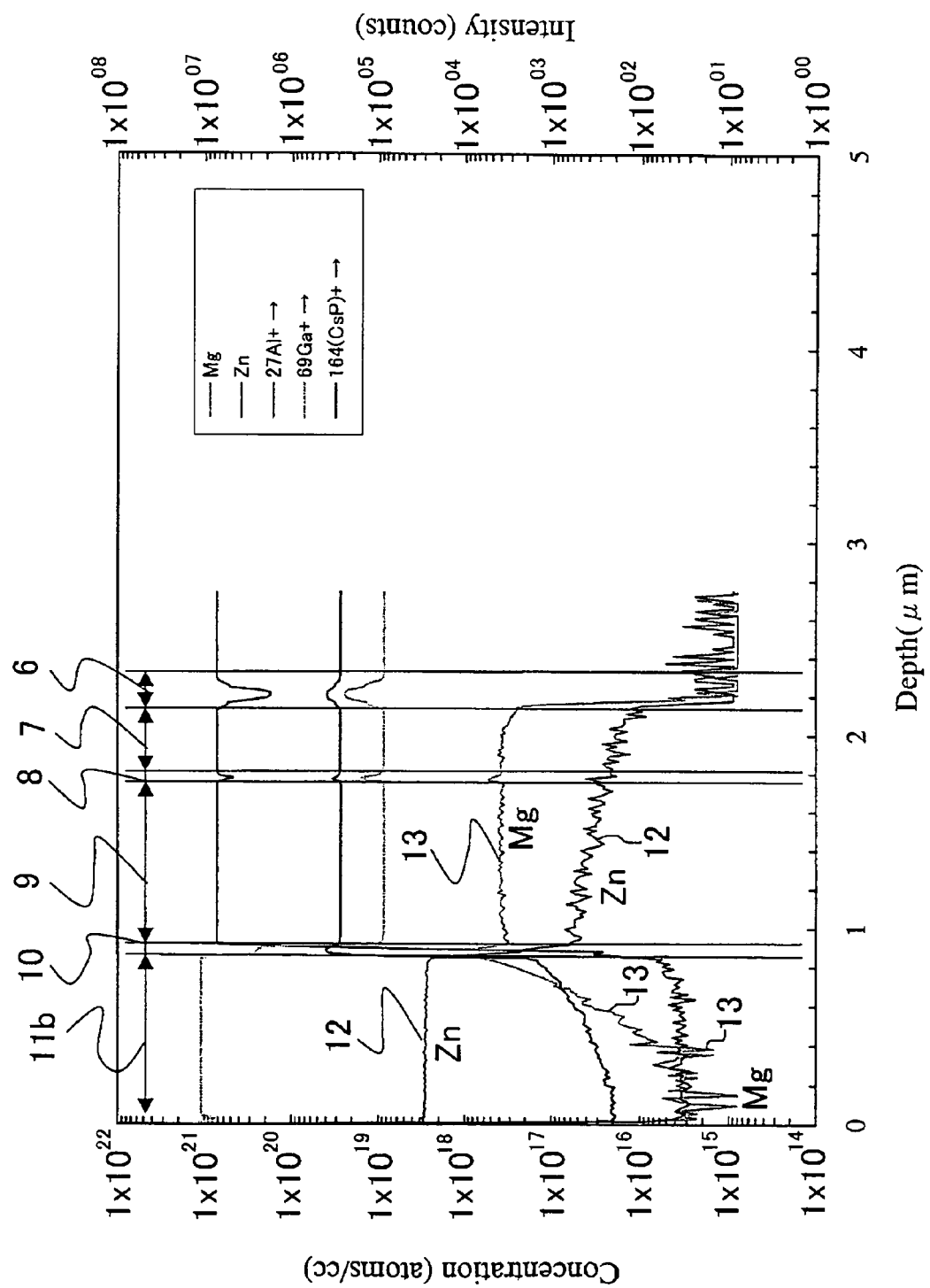
FIG. 4 is a diagram showing the SIMS analysis results of an epitaxial wafer for semiconductor light-emitting devices (LDs) using a conventional Zn-doped cap layer.

For comparison, FIG. 4 shows the SIMS analysis results of a prior art where the p-type cap layer 11 consists of a Zn-doped p-type cap layer 11b only. It is seen that the Zn concentration shown by curve 12 in the Mg-doped p-type first cladding layer 7 and the Mg-doped p-type second cladding layer 9 is high so that Zn diffuses into the active layer 6.

Device characteristics of a red semiconductor laser fabricated using the epitaxial wafer of the invention are very good.

Embodiment 2

For the zinc diffusion suppression layer (Mg-doped p-type cap layer 11a) of the invention, the amount of Mg doped can be freely set to some degree. Accordingly, as another embodiment, by setting the carrier concentration of the Mg-doped p-type cap layer 11a that is the zinc diffusion suppression layer to $4 \times 10^{18}$ cm$^{-3}$, and likewise the carrier concentration of the Zn-doped p-type cap layer 11b to $4 \times 10^{18}$ cm$^{-3}$, similar effects can be exhibited.

Embodiment 3

As shown in FIG. 3, on an n-type substrate 21 made of GaAs are sequentially epitaxially grown an n-type buffer layer 22 made of GaAs, an n-type DBR (distributed Bragg reflector) layer 23 made of a thin-film multi-layer structure of $Al_{0.5}Ga_{0.5}As$ and AlAs, and an n-type cladding layer 24 made of $(Al_{0.7}Ga_{0.3})_{0.5}In_{0.5}P$, on which are sequentially grown a multi-quantum well (MQW) active layer 25 constituted by a barrier layer and a strained GaInP well layer, a Mg-doped p-type cladding layer 26 made of $(Al_{0.7}Ga_{0.3})_{0.5}In_{0.5}P$, and a p-type current diffusion layer 27 made of GaP.

And on the top portion are sequentially grown a Mg-doped p-type cap layer 28a made of GaAs serving as the zinc diffusion suppression layer of the invention, and a Zn-doped p-type cap layer 28b made of GaAs. Here, the Mg-doped p-type cap layer 28a on the Mg-doped p-type cladding layer 26 side is 70 nm in thickness and $1 \times 10^{18}$ cm$^{-3}$ in carrier concentration, and the Zn-doped p-type cap layer 28b on the upper side is 450 nm in thickness and $5 \times 10^{18}$ cm$^{-3}$ in carrier concentration.

Further, while the thicknesses of the Mg-doped p-type cap layer in above Embodiments 1 and 3 are respectively 50 nm and 70 nm, it is preferred that they are practically more than 30 nm to less than 100 nm.

It is because the zinc concentration which causes no practical problem in the layers below the zinc diffusion suppression layer is less than approximately $1 \times 10^{16}$ cm$^{-3}$, and realizing that degree of zinc concentration requires more than 30 nm-thick zinc diffusion suppression layer.

It is also because the practically allowable resistance in semiconductor light-emitting devices is less than approximately 3 Ω, and realizing that degree of resistance requires less than 100 nm-thick zinc diffusion suppression layer.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. An epitaxial wafer for semiconductor light-emitting devices, comprising:
   an n-type substrate;
   an n-type cladding layer;
   an active layer;
   an Mg-doped p-type cladding layer; and
   a p-type cap layer comprising an Mg-doped cap layer and a Zn-doped cap layer that are sequentially formed,
   wherein the n-type cladding layer, the active layer, the p-type cladding layer and the p-type cap layer are sequentially formed on the n-type substrate, and
   wherein the Mg-doped cap layer is provided between the Zn-doped cap layer and the Mg-doped p-type cladding layer.

2. The epitaxial wafer according to claim 1, wherein:
   the n-type substrate comprises GaAs,
   the n-type cladding layer comprises AlGaInP,
   the p-type cladding layer comprises AlGaInP, and
   the p-type cap layer comprises GaAs.

3. An epitaxial wafer for semiconductor light-emitting devices, comprising:
   an n-type substrate;
   an n-type cladding layer;
   an active layer;
   a first p-type cladding layer;
   a p-type etch stop layer;
   a second p-type cladding layer; and
   a p-type cap layer comprising an Mg-doped cap layer and a Zn-doped cap layer that are sequentially formed,
   wherein the n-type cladding layer, the active layer, the first p-type cladding layer, the p-type etch stop layer, the second p-type cladding layer and the p-type cap layer are sequentially formed on the n-type substrate,
   wherein the first p-type cladding layer, the p-type etch stop layer, and the second p-type cladding layer comprise Mg as a p-type dopant, and
   wherein the Mg-doped cap layer is provided between the Zn-doped cap layer and the second p-type cladding layer.

4. The epitaxial wafer according to claim 3, wherein:
   the n-type substrate comprises GaAs,
   the n-type cladding layer comprises AlGaInP, the first p-type cladding layer comprises AlGaInP,
the second p-type cladding layer comprises AlGaInP, and
the p-type cap layer comprises GaAs.

5. The epitaxial wafer according to claim 4, wherein: the p-type etch stop layer comprises GaInP.

6. The epitaxial wafer according to claim 1, further comprising:
a p-type intermediate layer formed between the p-type cladding layer and the Mg-doped cap layer,
wherein the p-type intermediate layer is doped with Mg that reduces an interface resistance due to a bandgap discontinuity between the p-type cladding layer and the p-type cap layer.

7. The epitaxial wafer according to claim 2, further comprising:
a p-type intermediate layer formed between the p-type cladding layer and the Mg-doped cap layer,
wherein the p-type intermediate layer is doped with Mg that reduces an interface resistance due to a bandgap discontinuity between the p-type cladding layer and the p-type cap layer.

8. The epitaxial wafer according to claim 6, wherein: the p-type intermediate layer comprises GaInP.

9. The epitaxial wafer according to claim 7, wherein: the p-type intermediate layer comprises GaInP.

10. An epitaxial wafer for semiconductor light-emitting devices, comprising:
a substrate comprising GaAs;
compound semiconductor layers epitaxially grown on the substrate; and
a cap layer formed as a top layer on the compound semiconductor layers,
wherein the compound semiconductor layers comprises a p-type layer comprising Mg as a p-type dopant,
wherein the cap layer comprises a GaAs series material, and
wherein the cap layer comprises an Mg-doped cap layer and Zn-doped cap layer that are formed sequentially, and the Mg-doped cap layer is provided between the Zn-doped cap layer and the Mg-doped p-type layer in the compound semiconductor layers.

* * * * *